(12) United States Patent
Sui et al.

(10) Patent No.: US 6,741,957 B1
(45) Date of Patent: May 25, 2004

(54) ANALYTICAL TIRE MODEL FOR VEHICLE DURABILITY AND RIDE COMFORT ANALYSIS

(75) Inventors: Jun S Sui, Lake Orion, MI (US); John A Hirshey, II, Troy, MI (US)

(73) Assignee: DaimlerChrysler Corporation, Auburn Hills, MI (US)

( * ) Notice: Subject to any disclaimer, the term of this patent is extended or adjusted under 35 U.S.C. 154(b) by 816 days.

(21) Appl. No.: 09/620,933

(22) Filed: Jul. 21, 2000

(51) Int. Cl.[7] ........................ G06F 17/50; G01M 17/04
(52) U.S. Cl. ................................ 703/8; 703/2; 73/146
(58) Field of Search ........................... 703/2, 8; 73/146

(56) References Cited

U.S. PATENT DOCUMENTS

| | | | |
|---|---|---|---|
| 4,434,652 A | 3/1984 | Christie | 73/146 |
| 4,584,873 A | 4/1986 | Ongaro | 73/146 |
| 5,289,718 A | 3/1994 | Mousseau | 73/146 |
| 5,313,827 A | 5/1994 | Yovichin | 73/146 |
| 5,347,588 A | 9/1994 | Wilson | 382/104 |
| 5,357,799 A | 10/1994 | Roth et al. | 73/146 |
| 5,398,545 A | 3/1995 | Blazic et al. | 73/146 |
| 5,485,406 A | 1/1996 | Wada et al. | 702/167 |
| 5,616,839 A | 4/1997 | Chen et al. | 73/146 |
| 5,773,717 A | 6/1998 | Reinhardt et al. | 73/146 |
| 5,789,668 A | 8/1998 | Coe et al. | 73/146 |
| 5,880,362 A | 3/1999 | Tang et al. | 73/146 |
| 5,900,542 A | 5/1999 | Fricke et al. | 73/146 |
| 5,930,155 A | 7/1999 | Tohi et al. | 703/8 |

OTHER PUBLICATIONS

Ray, L.R. Nonlinear State and Tire Force Estimation for Advanced Vehicle Control, IEEE Transactions on Control Systems Technology, vol. 3, No. 1, Mar. 1995, pp. 117–124.*

Lacombe, J. Tire Model for Simulations of Vehicle Motion on High and Low Friction Road Surfaces, IEEE, Simulation Conference Proceedings, Dec. 2000, vol. 1, pp. 1025–1034.*

Davis, A Radial–Spring Terrain Enveloping Tire Model, 1974, 55–69, Vehicle System Dynamics 3.

* cited by examiner

Primary Examiner—Russell Frejd
(74) Attorney, Agent, or Firm—Ralph E. Smith

(57) ABSTRACT

A method of modeling a tire is provided. The tire model is used in simulating vehicle response to a simulated ground profile. The tire has an undeformed envelope that defines the outer circumference when no forces are exerted on the tire. The method includes the steps of mathematically characterizing the tire undeformed envelope and a simulated ground profile. Integrating the characterized simulated ground profile and the characterized tire undeformed envelope with respect to the horizontal direction such that a tire deformed area is determined. Calculating the magnitude of the resultant force vector from the deformed area. Determining the direction of the resultant force vector.

18 Claims, 3 Drawing Sheets

ANALYTICAL TIRE MODEL FOR VEHICLE DURABILITY AND RIDE COMFORT ANALYSIS

BACKGROUND AND SUMMARY OF THE INVENTION

The present invention relates generally to vehicle simulations for ride, handling, and road load prediction. In particular, the present invention relates to an analytical tire model that is used for vehicle simulations.

The use of simulations has become an important design tool of the automotive industry for predicting vehicle ride and load characteristics. A critical component of these simulations is the tire model used to characterize the interaction between the tire and the ground. Due to the complexity of the tire structure and composition, a range of tire models are used depending on the particular simulation application. The tire models can be divided into three general categories; finite element models, lumped mass models, and analytical tire models.

Finite element tire models can provide highly accurate results for simulations of tire and vehicle interactions. However, finite element models require an excessive amount of computation time as well as requiring a complex and time consuming set-up. In addition, some nonlinear finite element models may not be stable for all operating conditions of the simulation, causing additional lost time determining the source of the instability.

Lumped mass tire models are particularly suited to simulating tire tread bend. This model type can be used to simulate tire local resonance and its interaction with the vehicle. In some cases a lumped mass tire model can be used to directly define the contact between the tread bend and road surface. Unfortunately, the lumped mass tire models are very difficult and costly to create, often requiring special tire tests, programs, and experience to create an accurate model of the physical tire.

Analytical tire models do not require the detailed modeling of the physical tire that the finite element and lumped mass tire models both require. Instead of providing a detailed model of the physical tire, an analytical tire model uses global tire parameters such as tire radial stiffness, radial damping, and tire radius to model a tire. Using global tire parameters simplifies the creation of the tire model and leads to much faster computation times. However, since the physical tire is not modeled, mathematical assumptions must be made in order to simulate the interaction of the tire and the road surface. Determining what assumptions to use and how to mathematically implement those assumptions is generally determinative of the tire model accuracy and computation speed.

The first analytic tire model was created during the '60s. Since then, numerous types of analytic tire models have been created, each based on different assumptions and having varying limitations in the usage of the particular model. Currently, various mathematical implementations of the radial spring tire model are the most widely used conventional analytical tire models because of the simplicity and accuracy compared with other analytical models. Referring to FIGS. 1A and 1B, radial spring tire models in general rely on the assumption that a tire is formed by a series of radial springs emanating from the center of the tire. At every time step as the tire progresses, the deformed area between the road profile and the tire undeformed envelope is calculated from the deformation of the radial springs. One method that many of the radial spring models employ to determine the magnitude of the resultant force is by hypothetically pressing the tire on a flat surface to deform the same area. Likewise, the angle of the resultant force is determined by summing all of the radial spring forces. Generally speaking, for gradually changing road surfaces conventional radial spring models provide reasonably accurate results. However, suddenly changing surfaces such as a step or pothole road input, may cause conventional radial spring models to provide inaccurate results. Due to the assumptions that were made in mathematically describing conventional radial spring models, the models do not always converge when a step input or pothole input is used as the ground profile for the simulation. In addition, for ground profile inputs similar to a step input, the models generally require excessive computation time in order to complete the numerical iterations that are necessitated for convergence.

Therefore, it is an object of the invention to provide an analytical tire model that can be used in vehicle simulations to accurately predict the tire and vehicle interaction when subjected to a predetermined ground profile. Also, it is desirable for the tire model to minimize the computation time required for the simulation. Additionally, it is an object to provide a tire model that is easily created. Also, it is desirable for the tire model to provide accurate simulation results when subjected to a ground profile describing a sudden change such as a step input.

To achieve the foregoing objectives an analytical tire model is provided for modeling a tire for use in simulating vehicle response to a simulated ground profile. The tire is described by an undeformed envelope that is mathematically characterized. The difference between the tire undeformed envelope and the ground profile is integrated with respect to the horizontal direction in order to determine the tire deformed area. The magnitude of a resultant force vector acting on the tire is calculated from the deformed area. The direction of the resultant force vector is combined with the magnitude of the resultant force vector.

The above described system is only an example. Systems in accordance with the present invention may be implemented in a variety of ways.

BRIEF DESCRIPTION OF THE DRAWINGS

These and other objects of the present invention, as well as the advantages thereof over other analytical tire models will become apparent to those skilled in the art from the following detailed description in conjunction with the attached drawings.

DETAILED DESCRIPTION OF THE PREFERRED EMBODIMENT

Figure 1A:
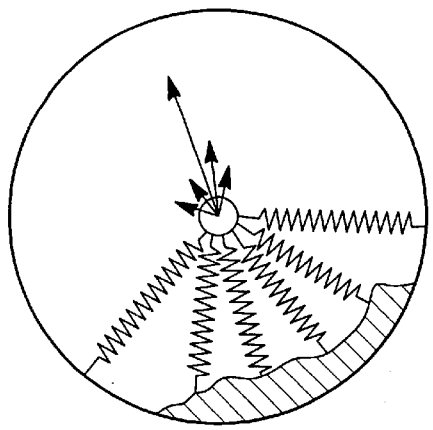
FIGS. 1A and 1B illustrate a radial spring tire model.
Figure 1B:
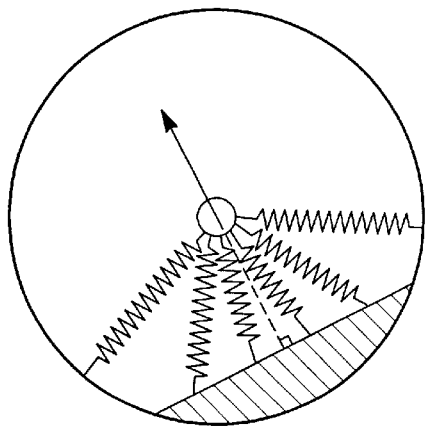
Figure 2:
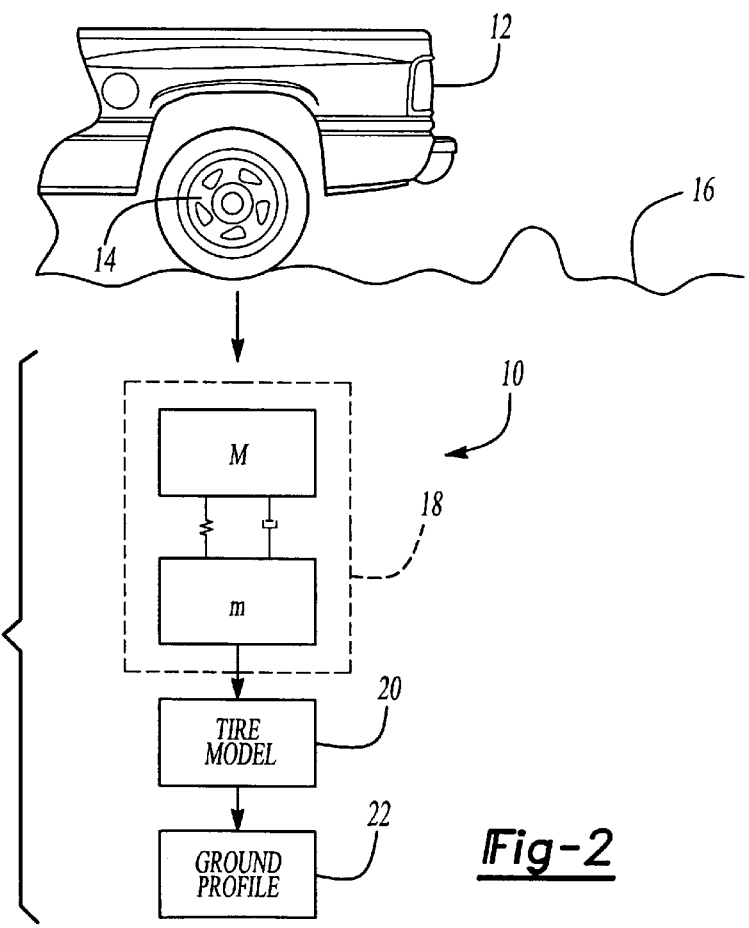
FIG. 2 is a block diagram of a presently preferred embodiment of a simulator including a tire model in accordance with the principles of the invention.

Referring to FIG. 2, a system model 10 for simulating the interaction between a vehicle 12 and a tire 14 when subjected to an actual ground profile 16 is illustrated. In the presently preferred embodiment, the system model 10 is incorporated in a Simulink simulation, however the scope of the invention includes using other simulation programs including mathematical simulation programs such as Matlab, as well as using multi-body dynamic simulation programs such as ADAMS and DADS. The system model 10 includes a quarter vehicle model 18 representing spindle-coupled sprung and unsprung mass. Those skilled in the art will readily recognize that there are numerous means of representing the vehicle model 18 other than the present implementation.

Figure 3:
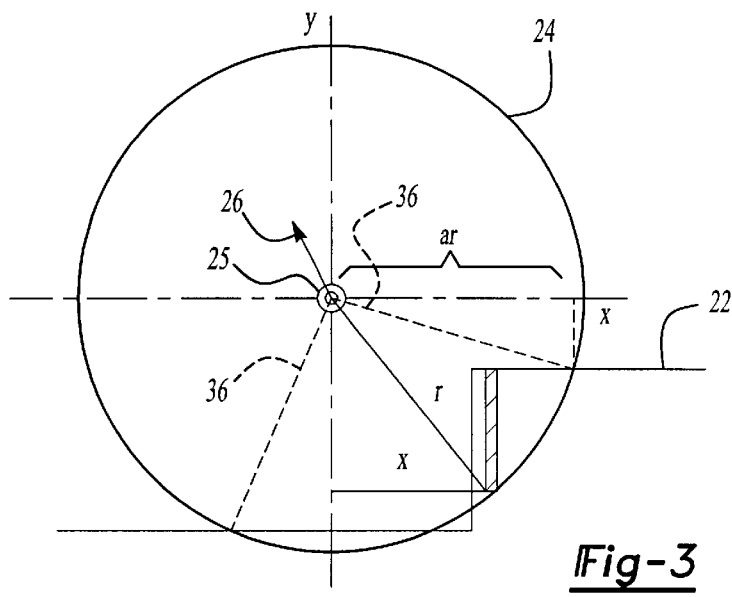
FIG. 3 illustrates a presently preferred embodiment of a tire model in accordance with principles of the invention.

A tire model 20 in accordance with the principles of the invention is coupled to the vehicle model 18. The tire model 20 describes the tire characteristics so that the interaction between the tire 14 and a ground profile 16 may be simulated analytically without detailed modeling of the physical tire. Referring to FIG. 3, the relationship between the ground profile 22 and the tire undeformed envelope 24 is illustrated. Located at approximately the center of the tire undeformed envelope 24 is the spindle 25 about which the tire 14 rotates. A resultant force 26 is exerted upon the spindle 25 due to the interaction of the tire 14 and the ground profile 22. To determine the magnitude of the resultant force 26, the tire deformed area lying between the road profile 22 and the tire undeformed envelope 24 is calculated. The invention recognizes that integrating with respect to the horizontal axis provides an accurate determination of the tire deformed area, from which the magnitude of the resultant force 26 may be determined.

Figure 4:
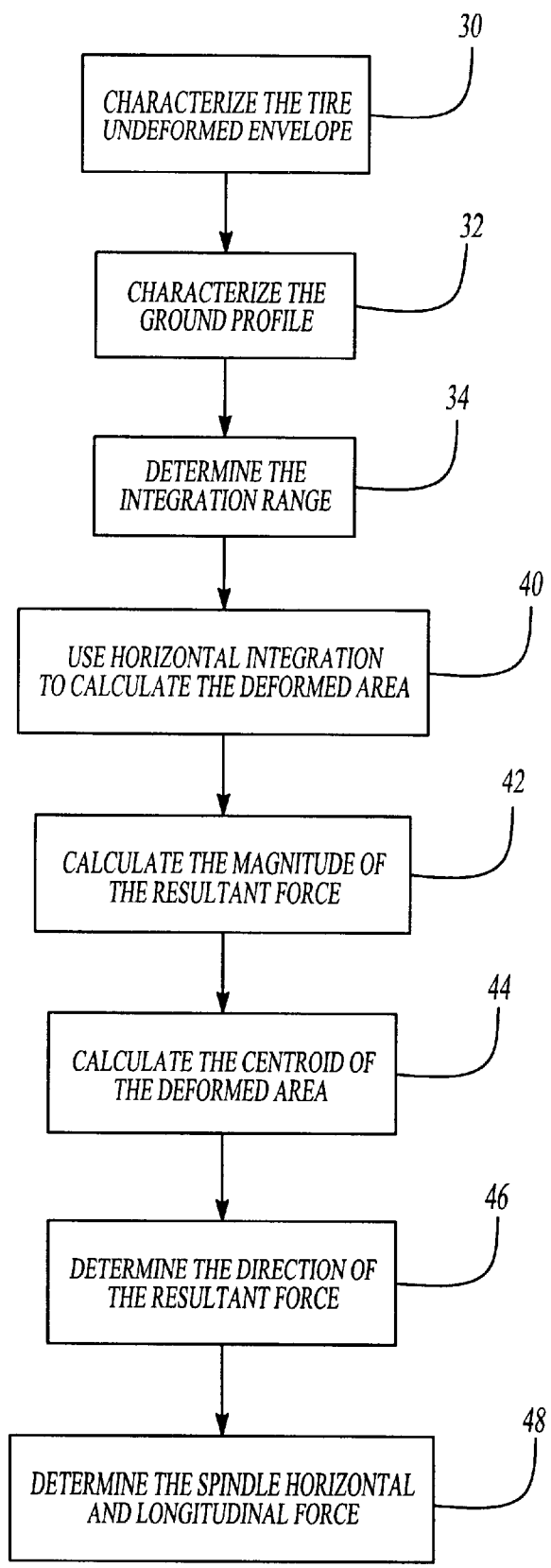
FIG. 4 illustrates a presently preferred embodiment of a method of simulating the interaction between the vehicle and a ground profile.

Referring to FIG. 4, a presently preferred method of modeling a tire in conformance with the principles of the invention is illustrated. At steps 30 and 32, the tire undeformed envelope 24 and the ground profile 22 are mathematically characterized. At step 34, an integration range over which the horizontal integration is to be conducted is determined. In the presently preferred embodiment, the integration range is determined to be an integration range ratio that is selected after evaluating the intersection of the ground profile 22 with the tire undeformed envelope 24. With additional reference to FIG. 3, construction lines 36 are projected from the tire center to the intersection of the ground profile 22 and the tire undeformed envelope 24. The integration range ratio is then selected based on the angle of the construction lines 36 relative to the horizontal. By limiting the range over which the integration is performed, the duration of the simulation time is further decreased. For simulations in which the ground profile 22 describes potholes and curb strikes, the integration range is set somewhat broader relative to a flat surface to ensure that the entire deformed area is included within the range. Although, in the presently preferred embodiment the magnitude of the positive and negative integration range limits are equivalent, it is within the scope of the invention for the magnitudes to differ. In addition, it is within the scope of the invention to select fixed values for the integration range such as "+r" and "−r". At step 40, horizontal integration is used for determining the deformed area, DA.

$$DA = \int_{-ar}^{ar} \left( q(x) - y + \sqrt{r^2 - x^2} \right) dx$$

where;

$$q(x) - y + \sqrt{(r^2 - x^2)} = 0 \text{ when } q(x) - y + \sqrt{r^2 - x^2} < 0$$

"q(x)" is the ground profile, and "a" is the integration range ratio.

At step 42, the magnitude of the resultant force 26 is determined from the spindle deformed displacement, DD. The deformed displacement is the distance the spindle moves when the tire 16 is hypothetically pressed on a flat surface to deform the same area as the deformed area. The deformed displacement may also be calculated by determining the length of a perpendicular bisector extended from the deformed tire envelope to the undeformed tire envelope. One method of mathematically calculating the resultant force magnitude is as follows:

$$|Fr| = K * DD$$

where; "K" is the radial stiffness of the tire, and "DD" is a function of the deformed area.

The variable "K" is generally obtained from manufacturer's data that illustrates the relationship between tire loading and deformed displacement, DD, for a tire. Following is a method of calculating the deformed displacement:

$$DD = r \cdot (1 - \cos(\theta/2))$$

$$\theta - \sin\theta = \frac{2 \cdot DA}{r^2}$$

where: "r" is the radius of the undeformed envelope, and "θ" is the angle formed by extending a perpendicular bisector from the envelope of the deformed tire to the undeformed area envelope.

In the presently preferred embodiment of the invention, the direction of the resultant force 26 is determined by connecting a hypothetical line from the deformed area centroid to the tire center. However, it is within the scope of the invention to calculate the resultant force direction by using other analytical tire models such as the circumferential integration radial spring tire model. Also, although the presently preferred embodiment uses horizontal integration to determine the centroid, the scope of the invention encompasses using other methods to calculate the centroid of the deformed area. A presently preferred method for calculating the deformed area centroid is described by the following equations, step 44:

$$X_c = \left( \int_{-ar}^{ar} \left( q(x) - y + \sqrt{r^2 - x^2} \right) x \, dx \right) / A$$

$$Y_c = \left( \int_{-ar}^{ar} \frac{1}{2} \left( q(x) - y + \sqrt{r^2 - x^2} \right) \left( q(x) + y - \sqrt{r^2 - x^2} \right) dx \right) / A$$

where;

$$q(x) - y + \sqrt{(r^2 - x^2)} = 0 \text{ when } q(x) - y + \sqrt{r^2 - x^2} < 0$$

"q(x)" is the ground profile, and "a" is the integration range ratio.

At step 46, the direction of the resultant force is determined by constructing a line from the centroid of the deformed area to the center of the tire. The direction of the resultant force is approximately in the same direction as the construction line. This aspect of the invention recognizes that the resultant force direction can be approximated by a line extending from the deformed area centroid to the tire center. Approximating the resultant force direction in this manner additionally reduces the computation time required for the simulation. At step 48, the spindle horizontal and vertical forces are determined from the resultant force.

Figure 5A:
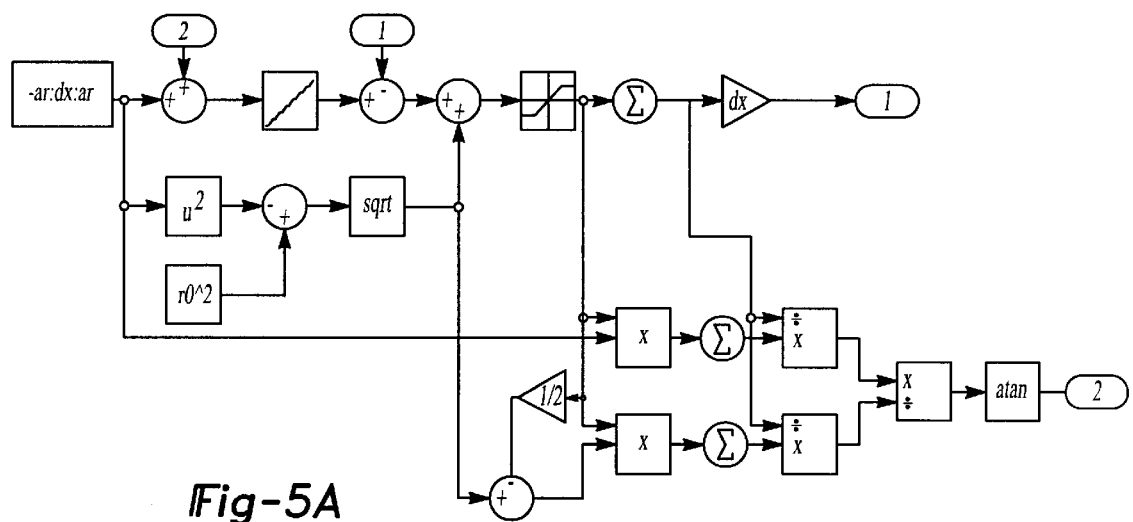
FIGS. 5A and 5B illustrate a simulation diagrams of a presently preferred embodiment for calculating vertical and horizontal spindle forces.
Figure 5B:
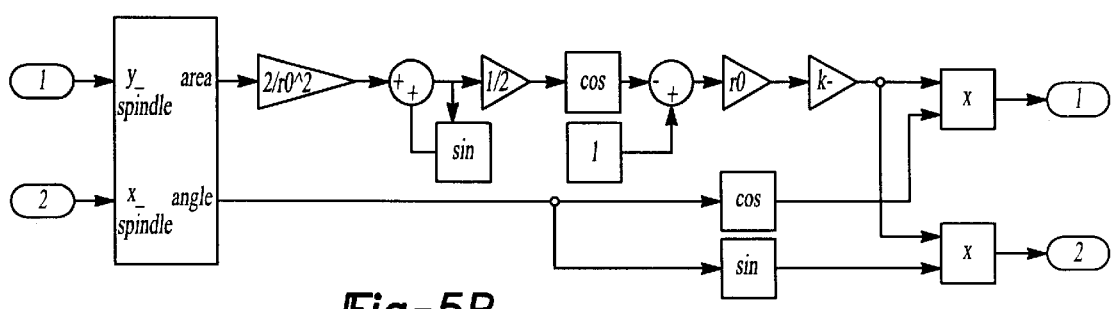

Referring to FIGS. 5A and 5B, presently preferred Simulink diagrams in accordance with the teachings of the invention illustrate the models used for calculating deformed area, area centroid direction, vertical spindle force, and horizontal spindle force of a vehicle and ground profile interaction. The tire model used in the Simulink diagrams uses horizontal integration to determine the deformed area and additionally approximates the determination of the resultant force direction by constructing a line from the deformed area centroid to the tire center. Although the presently preferred embodiment includes using both horizontal integration and the above described approximation for resultant force direction, it is within the scope of the invention to include only horizontal integration or only the resultant force direction approximation.

Although certain preferred embodiments of the invention have been herein described in order to afford an enlightened understanding of the invention, and to describe its principles, it should be understood that the present invention is susceptible to modification, variation, innovation and alteration without departing or deviating from the scope, fair meaning, and basic principles of the subjoined claims.

What is claimed is:

1. A method of modeling a tire exerting a resultant force on a spindle coupled to a center of the tire for use in simulating vehicle response to a simulated ground profile, the resultant force having a magnitude and a direction, the tire having an undeformed envelope describing an outer circumference of the tire, the method comprising:
   orienting the simulated ground profile and the undeformed envelope within a coordinate system having a horizontal direction and a vertical direction;
   mathematically characterizing the tire undeformed envelope;
   mathematically characterizing the simulated ground profile;
   integrating the characterized simulated ground profile and the characterized tire undeformed envelope with respect to the horizontal direction such that a tire deformed area is determined;
   calculating the magnitude of the resultant force vector from the deformed area;
   determining the direction of the resultant force vector; and
   determining a spindle horizontal force and vertical force from the resultant force vector.

2. A method of modeling a tire exerting a resultant force on a spindle coupled to a center of the tire for use in simulating vehicle response to a simulated ground profile, the resultant force having a magnitude and direction, the tire having an undeformed envelope describing an outer circumference of the tire, the method comprising:
   orienting the simulated ground profile and the undeformed envelope within a coordinate system having a horizontal direction and a vertical direction;
   mathematically characterizing the tire undeformed envelope;
   mathematically characterizing the simulated ground profile;
   integrating the characterized simulated ground profile and the characterized tire undeformed envelope with respect to the horizontal direction such that a tire deformed area is determined;
   calculating the magnitude of the resultant force vector from the deformed area;
   determining the direction of the resultant force vector by calculating a centroid of the deformed area; and
   determining the direction of the resultant force vector from the centroid; and
   determining a spindle horizontal force and vertical force from the resultant force vector.

3. The method of claim 2 wherein the centroid includes an X offset and a Y offset, and calculating the centroid includes:
   integrating a first integrand with respect to the horizontal direction to determine the X offset; and
   integrating a second integrand with respect to the horizontal direction to determine the Y offset.

4. The method of claim 3 wherein integrating the first integrand comprises solving, $$X_{offset} = \left( \int_{-ar}^{ar} (q(x) - y + \sqrt{r^2 - x^2}) x \, dx \right) \Big/ A$$

where;

$q(x)-y+\sqrt{(r^2-x^2)}=0$ when $q(x)-y+\sqrt{r^2-x^2}<0$

"q(x)" is the ground profile, and
"a" is the integration range ratio.

5. The method of claim 3 wherein integrating the second integrand comprises solving, $$Y_{offset} = \left( \int_{-ar}^{ar} \frac{1}{2}(q(x) - y + \sqrt{r^2 - x^2})(q(x) + y - \sqrt{r^2 - x^2}) \, dx \right) \Big/ A$$

where;

$q(x)-y+\sqrt{(r^2-x^2)}=0$ when $q(x)-y+\sqrt{r^2-x^2}<0$

"q(x)" is the ground profile, and
"a" is the integration range ratio.

6. A method of modeling a tire exerting a resultant force on a spindle coupled to a center of the tire for use in simulating vehicle response to a simulated ground profile, the resultant force having a magnitude and direction, the tire having an undeformed envelope describing an outer circumference of the tire, the method comprising:
   orienting the simulated ground profile and the undeformed envelope within a coordinate system having a horizontal direction and a vertical direction;
   mathematically characterizing the tire undeformed envelope;
   mathematically characterizing the simulated ground profile;
   integrating the characterized simulated ground profile and the characterized tire undeformed envelope with respect to the horizontal direction such that a tire deformed area is determined by solving, $$DeformedArea = \int_{-ar}^{ar} (q(x) - y + \sqrt{r^2 - x^2}) \, dx$$

where;

$q(x)-y+\sqrt{(r^2-x^2)}=0$ when $q(x)-y+\sqrt{r^2-x^2}<0$

"q(x)" is the ground profile, and
"a" is the integration range ratio;
   calculating the magnitude of the resultant force vector from the deformed area;
   determining the direction of the resultant force vector; and
   determining a spindle horizontal force and vertical force from the resultant force vector.

7. The method of claim 1 further comprising determining an integration range.

8. The method of claim 7 wherein determining the integration range includes evaluating the simulated ground profile.

9. A method of modeling a tire having a center and exerting a resultant force on a spindle coupled to the center for use in simulating vehicle response to a simulated ground profile, the resultant force having a magnitude and a direction, the tire having an undeformed envelope describing an outer circumference of the tire, the method comprising:

orienting the simulated ground profile and the undeformed envelope within a coordinate system having a horizontal direction and a vertical direction;

determining a tire deformed area resulting from the interaction of the simulated ground profile and the tire undeformed envelope;

determining the resultant force magnitude from the deformed area;

integrating with respect to the horizontal direction to determine a centroid of the deformed area;

constructing a hypothetical line from the deformed area centroid to the center of the tire;

selecting the direction of the resultant force vector to be approximately the direction of the hypothetical line; and determining a spindle horizontal force and vertical force from the resultant force vector.

10. The system of claim 9 wherein determining the tire deformed area comprises:

mathematically characterizing the tire undeformed envelope;

mathematically characterizing the simulated ground profile; and integrating the characterized simulated ground profile and the characterized tire undeformed envelope with respect to the horizontal direction such that the tire deformed area is determined.

11. The system of claim 9 wherein the centroid includes an X offset and a Y offset, and calculating the centroid includes:

integrating a first integrand with respect to the horizontal direction to determine the X offset; and integrating a second integrand with respect to the horizontal direction to determine the Y offset.

12. The method of claim 11 wherein integrating the first integrand and the second integrand comprise solving, $$X_{offset} = \left( \int_{-ar}^{ar} \left( q(x) - y + \sqrt{r^2 - x^2} \right) x \, dx \right) \Big/ A$$

$$Y_{offset} = \left( \int_{-ar}^{ar} \frac{1}{2} \left( q(x) - y + \sqrt{r^2 - x^2} \right) \left( q(x) + y - \sqrt{r^2 - x^2} \right) dx \right) \Big/ A$$

where;

$q(x) - y + \sqrt{(r^2 - x^2)} = 0$ when $q(x) - y + \sqrt{r^2 - x^2} < 0$

"q(x)" is the ground profile, and

"a" is the integration range ratio.

13. The method of claim 12, further comprising determining an integration range.

14. The method of claim 13 wherein determining the integration range includes evaluating the simulated ground profile.

15. A method of simulating a response of a vehicle to a simulated ground profile, the vehicle including a spindle for rotatably affixing a tire, the tire having a center and an undeformed envelope describing an outer circumference of the tire, a resultant force being exerted on the tire center due to interaction with the simulated ground profile, the spindle being subjected to a horizontal force and a vertical force, the method comprising:

providing a vehicle model to simulate the vehicle;

modeling the tire, including the steps of;

orienting the simulated ground profile and the undeformed envelope within a coordinate system having a horizontal direction and a vertical direction;

mathematically characterizing the tire undeformed envelope;

mathematically characterizing the simulated ground profile;

integrating the characterized simulated ground profile and the characterized tire undeformed envelope with respect to the horizontal direction such that a tire deformed area is determined;

calculating a magnitude of the resultant force from the determined deformed area; and determining a direction of the resultant force; and determining the spindle horizontal force and vertical force from the resultant force.

16. A method of simulating a response of a vehicle to a simulated ground profile, the vehicle including a spindle for rotatably affixing a tire, the tire having a center and an undeformed envelope describing an outer circumference of the tire, a resultant force being exerted on the tire center due to interaction with the simulated ground profile, the spindle being subjected to a horizontal force and a vertical force, the method comprising:

providing a vehicle model to simulate the vehicle;

modeling the tire, including:

orienting the simulated ground profile and the undeformed envelope within a coordinate system having a horizontal direction and a vertical direction;

mathematically characterizing the tire undeformed envelope;

mathematically characterizing the simulated ground profile;

integrating the characterized simulated ground profile and the characterized tire undeformed envelope with respect to the horizontal direction such that a tire deformed area is determined;

calculating a magnitude of the resultant force from the determined deformed area;

determining a direction of the resultant force by calculating a control of the deformed area; and determining the direction of the resultant force vector from the centroid; and determining a spindle horizontal force and vertical force from the resultant force vector.

17. The method of claim 16 wherein the centroid includes an X offset and a Y offset, and calculating the centroid includes:

integrating a first integrand with respect to the horizontal direction to determine the X offset; and integrating a second integrand with respect to the horizontal direction to determine the Y offset.

18. The method of claim 17 further comprising determining an integration range.

* * * * *